United States Patent
Kuksenkov et al.

(10) Patent No.: US 8,705,584 B2
(45) Date of Patent: Apr. 22, 2014

(54) DBR LASER DIODE WITH SYMMETRIC APERIODICALLY SHIFTED GRATING PHASE

(75) Inventors: Dmitri Vladislavovich Kuksenkov, Big Flats, NY (US); Dragan Pikula, Horseheads, NY (US); Rostislav Vatchev Roussev, Painted Post, NY (US)

(73) Assignee: Corning Incorporated, Corning, NY (US)

(*) Notice: Subject to any disclaimer, the term of this patent is extended or adjusted under 35 U.S.C. 154(b) by 334 days.

(21) Appl. No.: 13/292,433

(22) Filed: Nov. 9, 2011

(65) Prior Publication Data
US 2013/0114636 A1    May 9, 2013

(51) Int. Cl.
*H01S 5/00* (2006.01)

(52) U.S. Cl.
USPC .............................. 372/50.11; 372/50.1

(58) Field of Classification Search
CPC ... H01S 5/125; H01S 5/0625; H01S 5/06256; H01S 5/1096; H01S 5/12; H01S 5/124; H01S 5/1246
USPC ...................... 372/50.1, 50.11, 102
See application file for complete search history.

(56) References Cited

U.S. PATENT DOCUMENTS

| | | | |
|---|---|---|---|
| 5,878,066 A * | 3/1999 | Mizutani et al. | 372/27 |
| 6,432,736 B1 | 8/2002 | Lee et al. | 438/34 |
| 6,501,777 B1 | 12/2002 | Sato | |
| 6,548,320 B1 | 4/2003 | Kamath | 438/45 |
| 7,123,792 B1 | 10/2006 | Mears et al. | 385/37 |
| 7,505,492 B2 * | 3/2009 | Gollier et al. | 372/29.011 |
| 7,826,508 B2 | 11/2010 | Reid et al. | |
| 7,830,927 B2 | 11/2010 | Reid et al. | |
| 8,320,418 B2 * | 11/2012 | Kuksenkov et al. | 372/22 |
| 8,573,785 B2 * | 11/2013 | Kuksenkov et al. | 353/94 |
| 2006/0209911 A1 | 9/2006 | Takabayashi | 372/20 |
| 2008/0232411 A1 | 9/2008 | Reid et al. | 372/20 |
| 2013/0114634 A1 * | 5/2013 | Kuksenkov et al. | 372/45.01 |

OTHER PUBLICATIONS

D.R. McDonald et. al. "WDM laser array with 2nm channel spacing fabricated using a grating phase mark" SPIE vol. 3004, pp. 2-5.*
Furukawa et al., "Effective Speckle Reduction in Laser Projection Displays", Proc. of SPIE vol. 6911, 2008.
Iio et al.; "Two-Longitudinal-Mode Laser Diodes"; EIII Photonics Technology Letters; vol. 7, No. 9, Sep. 1995.
Kuksenkov et al.; "Multiple-wavelength synthetic green laser source for speckle reduction"; SPIE vol. 7917, 79170B, 2011.
International Searching Authority; International Search Report; Mailing Date: Jan. 22, 2013; pp. 1-2.

* cited by examiner

*Primary Examiner* — Jessica Stultz
*Assistant Examiner* — Delma R Forde
(74) *Attorney, Agent, or Firm* — Gregory V. Bean

(57) ABSTRACT

In accordance with one embodiment of the present disclosure, a DBR laser diode is provided where the wavelength selective grating of the laser diode is characterized by an aperiodically shifted grating phase $\phi$ and a Bragg wavelength $\lambda_B$. The aperiodically shifted grating phase $\phi$ is substantially symmetric or substantially $\pi$-shifted symmetric relative to a midpoint $C_L$ or shifted midpoint $C_L^*$ of the DBR section. The phase $\phi$ of the wavelength selective grating is characterized by aperiodic phase jumps of magnitude $\phi_{J1, J2, \ldots}$ and segment lengths $l_{0, 1, \ldots}$. The phase jumps of the wavelength selective grating are arranged substantially symmetrically about a midpoint $C_L$ or shifted midpoint $C_L^*$ of the DBR section along the optical axis of the DBR laser diode. At least two phase jumps reside on each side of the midpoint $C_L$ or shifted midpoint $C_L^*$ of the DBR section.

18 Claims, 3 Drawing Sheets

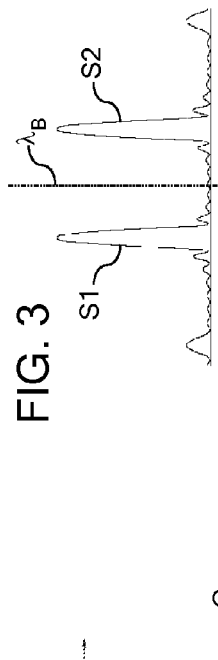
FIG. 1
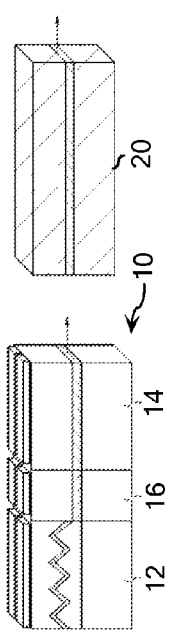
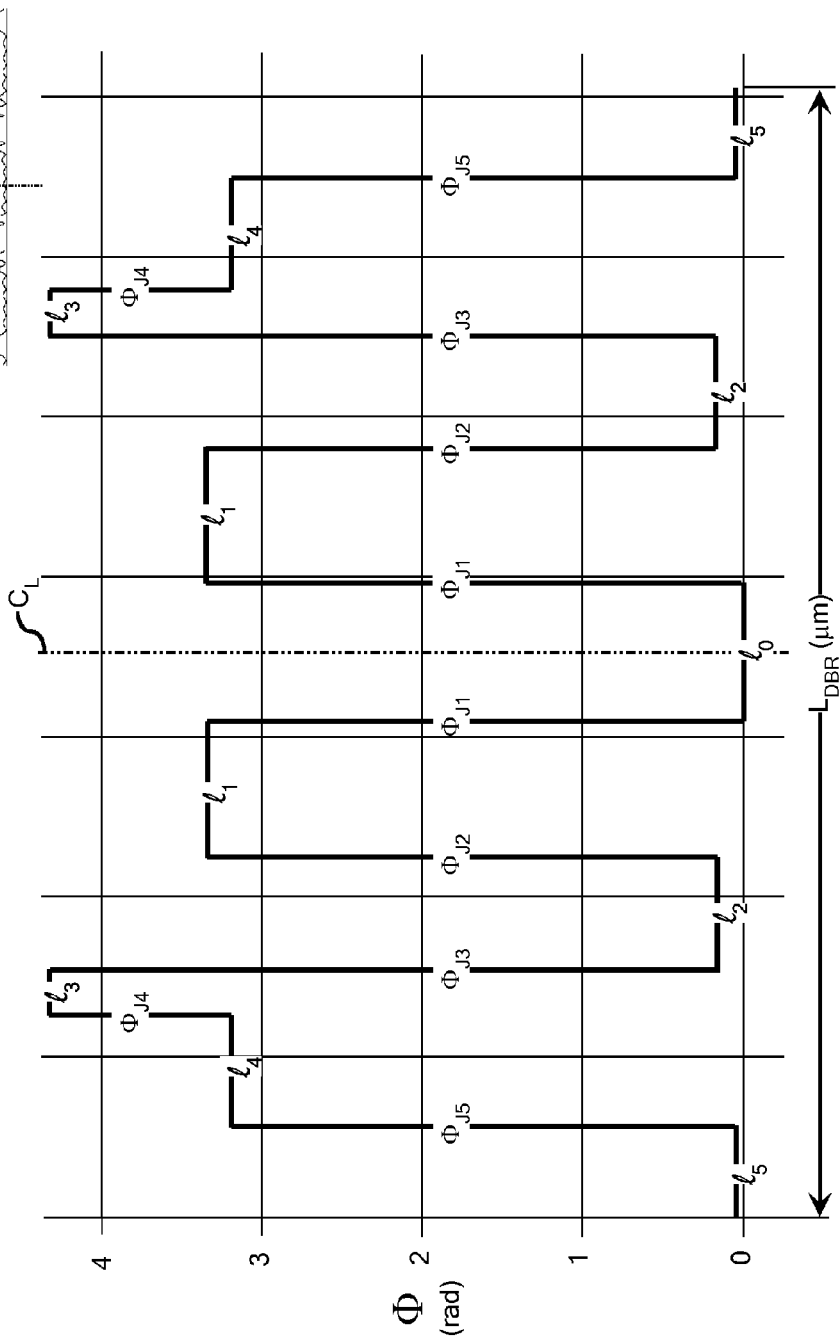
FIG. 2
FIG. 3

DBR LASER DIODE WITH SYMMETRIC APERIODICALLY SHIFTED GRATING PHASE

BACKGROUND

The present disclosure relates to laser diodes characterized by multi-wavelength emission and, more particularly, to distributed Bragg reflector (DBR) laser diodes where the wavelength selective grating of the laser diode generates multiple wavelength reflections simultaneously in the laser output spectrum. The present disclosure also relates to the use of a multi-wavelength laser diodes as a pump source for frequency up-conversion through second-harmonic (SHG) or sum-frequency (SFG) generation, as can be applied for conversion of an IR pump to emission in the green portion of the optical spectrum, for example.

BRIEF SUMMARY

Concepts of the present disclosure are particularly well-suited for speckle-reduced synthetic laser sources emitting, for example, in the green portion of the optical spectrum because, to reduce speckle, laser sources preferably emit several wavelengths simultaneously and utilize a wavelength conversion device with multiple phase-matching conversion peaks. The present inventors have recognized that when a DBR pump laser is operated in relatively short-pulsed regime, all wavelengths reflected by the wavelength selective grating of the DBR laser are generated simultaneously in the laser output spectrum. Accordingly, the ideal grating for the pump laser should reflect only the desired two or three pump wavelengths that will participate in frequency up-conversion through SHG or SFG. Lasing at other pump wavelengths is seen as parasitic and can reduce overall efficiency of the device since these additional pump wavelengths do not participate in the frequency up-conversion process. For many useful projection surfaces, up-converted output wavelengths are preferably separated by about 0.4 nm or more to allow speckle reduction via the addition of uncorrelated speckle patterns. For example, if two pump IR wavelengths produce three green output wavelengths via SHG and SFG, the two pump wavelengths should be separated by more than about 1.6 nm, so that the three green output wavelengths can be separated by more than about 0.4 nm.

Referring initially to FIG. 1, the general structure of a DBR laser diode 10 with wavelength selective output consists of at least two sections, a DBR section 12 with a wavelength selective grating and a gain section 14. Very often, a phase section 16 is also provided. FIG. 1 also illustrates a wavelength conversion device 20 schematically. The wavelength conversion device 20 is characterized by multiple phase-matching wavelength-conversion spectral peaks that are engineered to allow phase-matching of frequency doubling or sum-frequency mixing of light at fundamental wavelengths selected by the reflectivity peaks of the wavelength selective grating of the DBR section 12. Collectively, the laser 10 and the wavelength conversion device 20 form a frequency up-converted synthetic laser source. Beyond the details of the wavelength selective grating of the DBR section 12 disclosed herein, the specific manner of construction of the laser 10 and the wavelength conversion device 20 are beyond the scope of the present disclosure and can be readily gleaned from a variety of teachings on the subject.

Generally, the device length of the laser 10 will be limited. In practice most of the device length is typically allocated to gain section 14 of the laser 10 and the length of the DBR section 12 is often limited to approximately 700 μm. The present inventors recognize that the grating of the DBR section 12 should be designed to exhibit high reflectivity at two or three desired pump (IR) wavelengths, separated by more than about 1.6 nm. Further, the reflectivity of the DBR section 12 at other wavelengths should be as small as possible to avoid generating unused IR light. In many cases, the respective reflectivities of individual peaks of the grating should be approximately equal to allow stable operation of the pump laser simultaneously at all desired wavelengths over a wide range of pump power levels. In some embodiments, the phase profile of the grating can be shifted relative to the device center to compensate for some wavelength-dependence, or slope, in the gain spectrum of the laser.

In accordance with one embodiment of the present disclosure, a DBR laser diode is provided where the wavelength selective grating of the laser diode is characterized by an aperiodically shifted grating phase $\phi$ and a Bragg wavelength $\lambda_B$. The aperiodically shifted grating phase $\phi$ is substantially symmetric or substantially $\pi$-shifted symmetric relative to a midpoint $C_L$ or shifted midpoint $C_L^*$ of the DBR section. The phase $\phi$ of the wavelength selective grating is characterized by aperiodic phase jumps of magnitude $\phi_{J1, J2, \ldots}$ and segment lengths $l_{0, 1, \ldots}$. The phase jumps of the wavelength selective grating are arranged substantially symmetrically about a midpoint $C_L$ or shifted midpoint $C_L^*$ of the DBR section along the optical axis of the DBR laser diode. At least two phase jumps reside on each side of the midpoint $C_L$ or shifted midpoint $C_L^*$ of the DBR section.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a schematic illustration of a frequency up-converted synthetic laser source;

FIG. 2 is a phase-modulation diagram illustrating the properties of a symmetric aperiodically shifted wavelength selective grating according to the present disclosure;

FIG. 3 illustrates the reflectivity peaks typically associated with the symmetric aperiodically shifted wavelength selective grating of FIG. 2;

DETAILED DESCRIPTION

Figure 4:
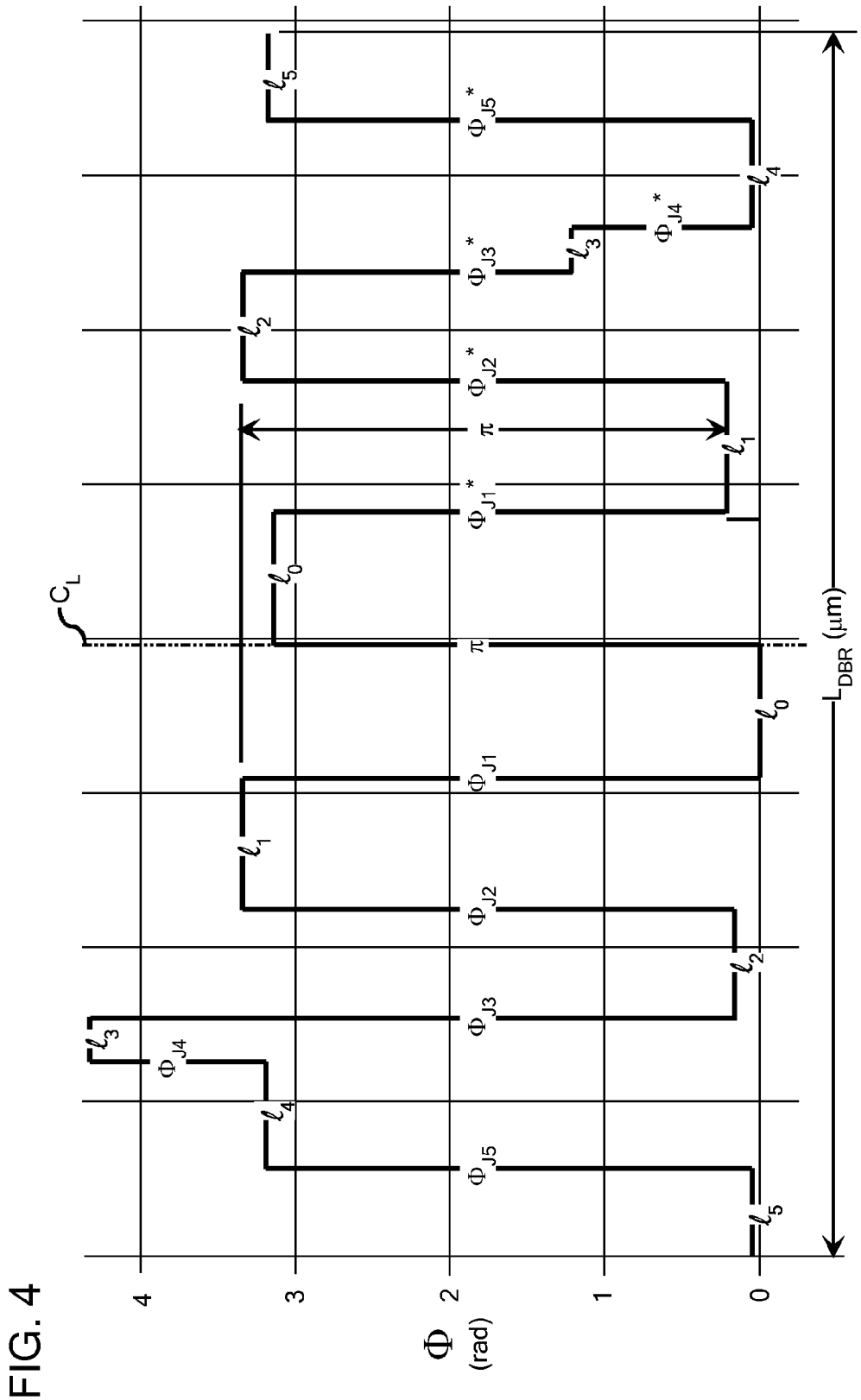
FIG. 4 is a phase diagram illustrating the properties of wavelength selective grating with aperiodic symmetrically positioned phase jumps and a $\pi$-phase shift in the center ($\pi$-shifted symmetric grating) according to the present disclosure.

As is noted above, the DBR laser diode 10 illustrated in FIG. 1 comprises a DBR section comprising a wavelength selective grating. The specific configuration of one type of wavelength selective grating according to the present disclosure is illustrated in the phase diagram of FIG. 2. More specifically, as is illustrated in FIG. 2, the wavelength selective grating is characterized by a Bragg wavelength $\lambda_B$ and an aperiodically shifted grating phase $\phi$. In FIG. 2, the aperiodically shifted grating phase ϕ is substantially symmetric relative to a midpoint $C_L$ of the DBR section along the optical axis of the DBR laser diode. Alternative configurations are illustrated with reference to FIGS. 4 and 5 below.

As will be appreciated by those familiar with DBR lasers, a DBR section of a DBR laser comprises a Bragg mirror, i.e., a light-reflecting device based on Bragg reflection at a periodic structure. The periodic structure of the DBR section defines the Bragg wavelength $\lambda_B$ of the laser and can be defined as follows $\lambda_B = 2n_{eff}\Lambda/m_d$, where $\Lambda$ is the fundamental period of the grating, $n_{eff}$ is the effective refractive index of the guided mode in the region of the grating, and $m_d$ is the diffraction order. In one example, a DBR laser using GaAs as the grating and gain medium, the grating period for a first-order grating, with $m_d=1$, is about 159 nm for a Bragg wavelength of about 1062 nm.

The phase ϕ of the wavelength selective grating is characterized by aperiodic phase jumps of magnitude $\phi_J$, which phase jumps are arranged symmetrically about the midpoint $C_L$ of the DBR section along the optical axis of the DBR laser diode 10. In the illustrated embodiment, these phase jumps are labeled $\phi_{J1}$, $\phi_{J2}$, $\phi_{J3}$, $\phi_{J4}$, and $\phi_{J5}$ and, taken with ϕ=0, represent five variables in the design of the wavelength selective grating. These shifts in phase can be obtained in practice by longitudinally shifting discrete sections of the grating by a distance $\phi\Lambda/2\pi$, where ϕ is the phase shift and $\Lambda$ is the fundamental period of the unperturbed grating. Methods to achieve this are well documented in the art and include, for example, using e-beam lithography with the shifts incorporated into the lithography patterns. It is contemplated that although the phase jumps are substantially vertical in the illustrated embodiments, the jumps may also comprise inclined or curved jumps, i.e., ramps.

Each of the phase jumps $\phi_{J1}$, $\phi_{J2}$, $\phi_{J3}$, $\phi_{J4}$, $\phi_{J5}$ represents a different phase shift in the illustrated embodiment but it is contemplated that two or more of the phase jumps $\phi_{J1}$, $\phi_{J2}$, $\phi_{J3}$, $\phi_{J4}$, $\phi_{J5}$ could be equal in magnitude. It is also contemplated that two or more of the constant-phase segments could have the same phase. For the illustration in FIG. 1, the phase reference level has been selected such that the phase in the center segment is 0. Specific examples of suitable constant phase levels resulting from the phase jumps are presented below with the corresponding segment lengths $l_0, l_2, l_3, l_4, l_5$ associated with the constant phase segments separating neighboring phase jumps. Each of the segment lengths $l_0, l_2, l_3, l_4, l_5$ has a different magnitude in the illustrated embodiment but it is contemplated that two or more of the segment lengths $l_0, l_2, l_3, l_4, l_5$ could be equal in magnitude. Together, the Bragg wavelength $\lambda_B$, the phase jumps $\phi_{J1}$, $\phi_{J2}$, $\phi_{J3}$, and $\phi_{J4}$, and the segment lengths $l_0, l_1, l_2, l_3, l_4, l_5$ are such that the wavelength selective grating exhibits two dominant reflectivity peaks, i.e., two peaks with reflectance maxima at least three times larger than all other reflectivity peaks attributable to the wavelength selective grating. These two peaks take the form of sidebands S1, S2 about the central Bragg wavelength $\lambda_B$ of the grating, as is illustrated in FIG. 3. In addition, it is noted that these two dominant reflectivity peaks can be separated by at least about 1.6 nm, meeting the requirements of the frequency up-converted laser sources discussed above. In addition, although not required, it is noted that the respective maxima of the two dominant reflectivity peaks are approximately equal.

The length $L_{DBR}$ of the wavelength selective grating along the optical axis of propagation of the DBR laser diode 10 is also illustrated in FIG. 2. Preferably, the length $L_{DBR}$ is within typical restrictions associated with DBR lasers, which are typically of limited length. For example, the present inventors recognize that the length $L_{DBR}$ is preferably between approximately 600 μm and approximately 750 μm. More specific DBR lengths $L_{DBR}$ are given below. In one embodiment, it is contemplated that the aperiodic phase modulation may be characterized by a substantially trapezoidal phase distribution where the phase jumps of the square-wave distribution are presented in the form of linear phase ramps, although trapezoidal phase profiles tend to generate a non-zero central peak in the reflectance spectrum of the grating. In another embodiment, it is contemplated that the relative magnitudes of the two reflectance peaks can be changed by shifting the phase profile with respect to the device center, i.e., along the x-axis of the phase diagram illustrated in FIG. 2. A difference in magnitude between the two dominant reflectivity peaks S1, S2 can be tailored to define a reflectivity slope with a magnitude that is approximately equivalent to the magnitude of the laser gain slope but has an opposite sign. The result is a laser diode where the two actual output lasing peaks are substantially equal even though there is a wavelength dependence in the gain spectrum of the laser. It is noted that the ratio of the peaks S1 and S2 can be changed within limits and that, generally, the fewer the periods of phase modulation in the DBR grating length, the larger the range of ratios of the two peaks. The term period here means the length separating two successive phase jumps of the same sense (e.g., "up" or "down" jumps). Although the period varies along the DBR grating length, we can count a total number of periods by the total number of phase jumps of the same sense.

The following table illustrates three specific wavelength selective grating configurations that fall within the scope of the present disclosure:

|  | 1st Design | | 2nd Design | | 3rd Design | |
| --- | --- | --- | --- | --- | --- | --- |
|  | l (μm) | ϕ (rad) | l (μm) | ϕ (rad) | l (μm) | ϕ (rad) |
| $\phi_5, l_5$ | 51.5740 | 0.0128 | 57.4470 | 0.0086 | 56.8170 | −0.1511 |
| $\phi_4, l_4$ | 63.6930 | 3.1692 | 69.6890 | 3.1720 | 70.8773 | 3.1450 |
| $\phi_3, l_3$ | 31.8530 | 4.0144 | 29.0350 | 4.3877 | 28.7858 | 4.3730 |
| $\phi_2, l_2$ | 72.4890 | 0.1148 | 70.5960 | 0.1167 | 69.4275 | 0.0522 |
| $\phi_1, l_1$ | 84.4920 | 3.3633 | 84.6870 | 3.3370 | 84.6900 | 3.2210 |
| $\phi_0, l_0$ | 83.3120 | 0.0000 | 86.7830 | 0.0000 | 86.7600 | 0.0000 |
| $\phi_1, l_1$ | 84.4920 | 3.3633 | 84.6870 | 3.3370 | 84.6900 | 3.2210 |
| $\phi_2, l_2$ | 72.4890 | 0.1148 | 70.5960 | 0.1167 | 69.4275 | 0.0522 |
| $\phi_3, l_3$ | 31.8530 | 4.0144 | 29.0350 | 4.3877 | 28.7858 | 4.3730 |
| $\phi_4, l_4$ | 63.6930 | 3.1692 | 69.6890 | 3.1720 | 70.8773 | 3.1450 |
| $\phi_5, l_5$ | 51.5740 | 0.0128 | 57.4470 | 0.0086 | 56.8170 | −0.1511 |
| Max. | 84.4920 | 4.0144 | 86.7830 | 4.3877 | 86.7600 | 4.3730 |
| Min. | 31.8530 |  | 29.0350 |  | 28.7858 |  |
| Avg. | 62.8649 | 1.9408 | 64.5174 | 2.0040 | 64.3596 | 1.9346 |
| Std Dev | 19.2837 | 1.8312 | 20.1364 | 1.9170 | 20.2720 | 1.9407 |

In each of the aforementioned grating designs the Bragg wavelength $\lambda_B$, the phase jumps $\phi_{J1}$, $\phi_{J2}$, $\phi_{J3}$, $\phi_{J4}$ and $\phi_{J5}$, and the segment lengths $l_0, l_2, l_3, l_4, l_5$ are such that the wavelength selective grating exhibits two dominant reflectivity peaks taking the form of sidebands S1, S2 about a central Bragg wavelength $\lambda_B$ of the grating, as is illustrated in FIG. 3. Although not required, the respective maxima of the two dominant reflectivity peaks can be tailored to be approximately equal.

Figure 5:
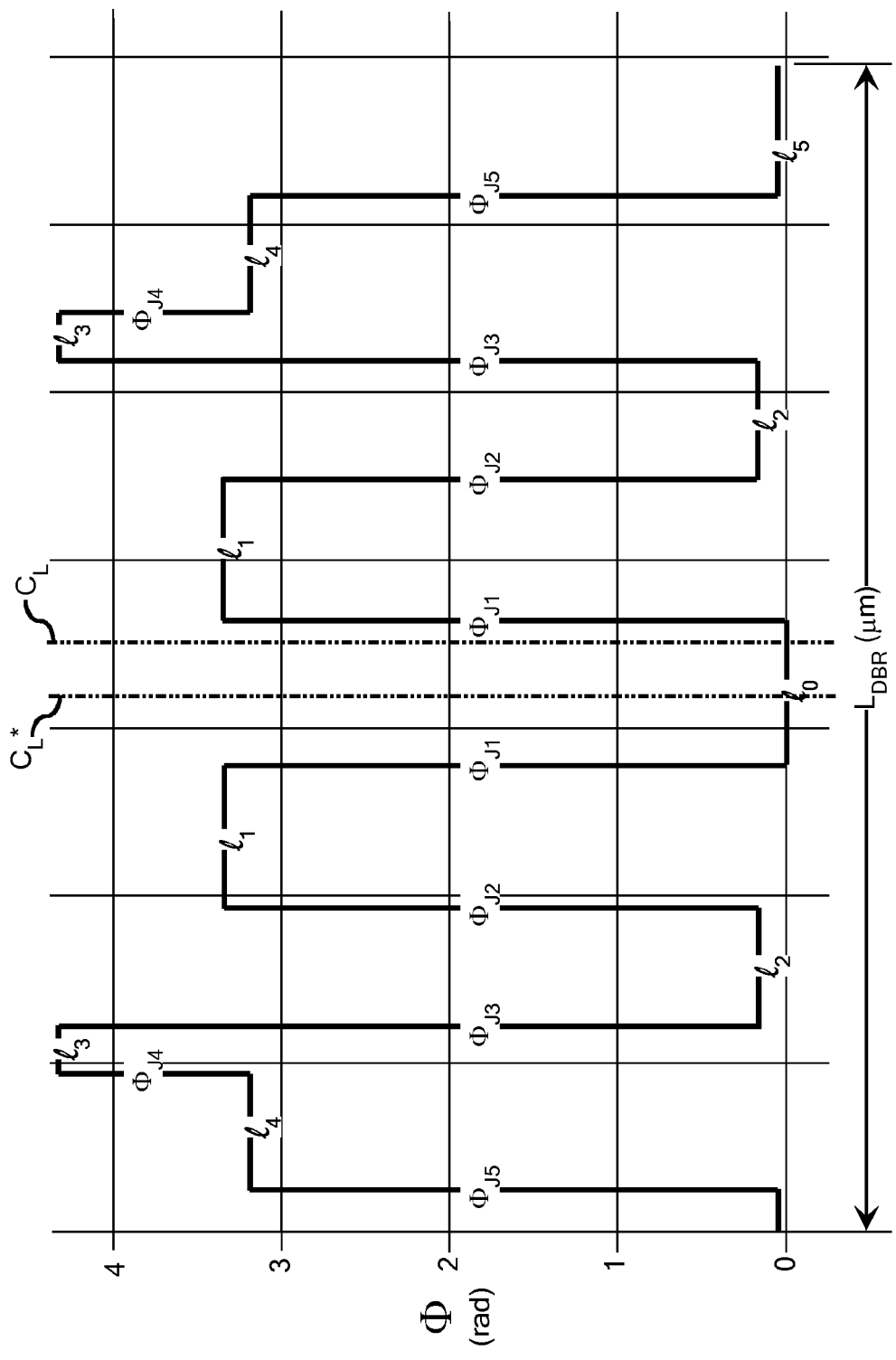
FIG. 5 is a phase diagram illustrating the properties of a symmetric aperiodically shifted wavelength selective grating where the symmetry of the grating is taken relative to a shifted midpoint $C_L^*$ of the DBR section according to the present disclosure.

Referring to FIGS. 4 and 5, it is noted that variations on the symmetric configuration illustrated in FIG. 2 are contemplated. Specifically, FIG. 4 illustrates what is described herein as a π-shifted symmetric configuration, representing a wavelength selective grating with aperiodic symmetrically positioned phase jumps and a π-phase shift in the center. In the π-shifted symmetric configuration, the segment lengths $l_0, l_2$, $l_3$, $l_4$, $l_5$ are equal on opposite sides of the midpoint $C_L$ but the phase values associated with corresponding segments on opposite sides of the midpoint $C_L$ differ by $\pi$ or an odd integer multiple of $\pi$. For example, in comparison with the symmetric grating of FIG. 2, the segment length $l_0$ has been reproduced on opposite sides of the midpoint $C_L$, with the left-side segment at 0 rad and the right-side segment at $\pi$ rad. Similarly, the segment lengths $l_1$ on opposite sides of the midpoint $C_L$ are also $\pi$-shifted relative to each other, and so on. The $\pi$ shifts for each common segment length may be positive or negative and may assume the value of $\pi$ or an odd integer multiple thereof. For clarity, it should be understood that reference herein to a "$\pi$-shifted symmetric" configuration covers configurations were the phase values associated with corresponding segments on opposite sides of the midpoint $C_L$ differ by $\pi$ or an odd integer multiple of $\pi$.

The configuration of FIG. 5 differs from that of FIG. 2 in that the symmetry of the grating is taken relative to a shifted midpoint $C_L^*$ of the DBR section, as opposed to the true midpoint $C_L$ of the DBR section. As is illustrated in FIG. 5, when the grating is shifted in this manner, the symmetry of the DBR section does not extend to the outermost segment lengths $l_5$. In practice, it is contemplated that grating shifts less than approximately one-tenth of the grating length, preferably approximately one-fifth off the grating length, are likely to be most practical.

In most embodiments, it is contemplated that segment lengths will generally be less than approximately 100 μm and, collectively, the segment lengths $l_0$, $l_1$ . . . will define a wavelength selective grating length $L_{DBR}$ that is between approximately 600 μm and approximately 750 μm and a distribution of lengths with standard deviation of approximately 20 μm±10%.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A DBR laser diode comprising a DBR section and a gain section, wherein:
    the DBR section comprises a wavelength selective grating;
    the wavelength selective grating is characterized by an aperiodically shifted grating phase φ and a Bragg wavelength $\lambda_B$;
    the aperiodically shifted grating phase φ is substantially symmetric or substantially π-shifted symmetric relative to a midpoint $C_L$ or shifted midpoint $C_L^*$ of the DBR section along the optical axis of the DBR laser diode;
    the phase φ of the wavelength selective grating is characterized by aperiodic phase jumps of magnitude $\phi_{J1, J2, . .}$ . and segment lengths $l_{0, 1, . . .}$;
    the phase jumps of the wavelength selective grating are arranged substantially symmetrically about a midpoint $C_L$ or shifted midpoint $C_L^*$ of the DBR section along the optical axis of the DBR laser diode; and
    at least two phase jumps reside on each side of the midpoint $C_L$ or shifted midpoint $C_L^*$ of the DBR section.

2. A DBR laser diode as claimed in claim 1 wherein:
    the aperiodically shifted grating phase φ is substantially symmetric relative to a midpoint $C_L$ of the DBR section along the optical axis of the DBR laser diode.

3. A DBR laser diode as claimed in claim 1 wherein:
    the aperiodically shifted grating phase φ is substantially symmetric relative to a shifted midpoint $C_L^*$ of the DBR section along the optical axis of the DBR laser diode.

4. A DBR laser diode as claimed in claim 1 wherein:
    the aperiodically shifted grating phase φ is substantially π-shifted symmetric relative to a midpoint $C_L$ of the DBR section along the optical axis of the DBR laser diode.

5. A DBR laser diode as claimed in claim 1 wherein:
    the aperiodically shifted grating phase φ is substantially π-shifted symmetric relative to a shifted midpoint $C_L^*$ of the DBR section along the optical axis of the DBR laser diode.

6. A DBR laser diode as claimed in claim 1 wherein:
    the aperiodically shifted grating phase φ is substantially symmetric or π-shifted symmetric relative to a shifted midpoint $C_L^*$ of the DBR section along the optical axis of the DBR laser diode; and
    the spatial shift of the center of the shifted midpoint $C_L^*$, relative to the midpoint $C_L$ is less than approximately one-tenth of the grating length.

7. A DBR laser diode as claimed in claim 1 wherein each segment length $l_0$, $l_1$, . . . is less than approximately 100 μm.

8. A DBR laser diode as claimed in claim 1 wherein the segment lengths $l_0$, $l_1$, . . . collectively define a distribution with standard deviation of approximately 20 μm±10%.

9. A DBR laser diode as claimed in claim 1 wherein the segment lengths $l_0$, $l_1$, . . . collectively define a wavelength selective grating length $L_{DBR}$ that is between approximately 600 μm and approximately 750 μm.

10. A DBR laser diode as claimed in claim 1 wherein the substantially symmetric aperiodically shifted grating phase φ is characterized by a substantially square or trapezoidal profile.

11. A DBR laser diode as claimed in claim 1 wherein the depth of successive phase jumps varies along the optical axis of the DBR laser diode.

12. A DBR laser diode as claimed in claim 1 wherein:
the DBR laser diode is combined with a wavelength conversion device to form a frequency up-converted laser source; and
the wavelength conversion device is characterized by multiple phase-matching conversion peaks allowing frequency up-conversion of the reflectivity peaks of the wavelength selective grating of the DBR section through second-harmonic and/or sum-frequency generation.

13. A DBR laser diode as claimed in claim 1 wherein each phase jump has a complementary phase jump of substantially equal magnitude and each constant-phase segment has a complementary constant-phase segment of substantially equal segment length on an opposite side of the midpoint $C_L$ or shifted midpoint $C_L^*$ of the DBR section.

14. A DBR laser diode as claimed in claim 1 wherein the Bragg wavelength $\lambda_B$, the phase jumps $\phi_{J1}$, $\phi_{J2}$, $\phi_{J3}$, and $\phi_{J4}$, and the segment lengths $l_0$, $l_1$, $l_2$, $l_3$, $l_4$, $l_5$ are such that the wavelength selective grating exhibits two dominant reflectivity peaks.

15. A DBR laser diode as claimed in claim 14 wherein the two dominant reflectivity peaks take the form of sidebands S1, S2 about a central Bragg wavelength $\lambda_B$ of the grating.

16. A DBR laser diode as claimed in claim 14 wherein the two dominant reflectivity peaks are separated by at least about 1.6 nm.

17. A DBR laser diode as claimed in claim 14 wherein respective maxima of the two dominant reflectivity peaks are approximately equal.

18. A DBR laser diode comprising a DBR section and a gain section, wherein:
the DBR section comprises a wavelength selective grating;
the wavelength selective grating is characterized by an aperiodically shifted grating phase φ and a Bragg wavelength $\lambda_B$;
the aperiodically shifted grating phase φ is substantially symmetric or substantially π-shifted symmetric relative to a midpoint $C_L$ or shifted midpoint $C_L^*$ of the DBR section along the optical axis of the DBR laser diode;
the phase φ of the wavelength selective grating is characterized by aperiodic phase jumps of magnitude $\phi_{J1, J2, \ldots}$ and segment lengths $l_{0, 1, \ldots}$;
each segment length $l_{0, 1, \ldots}$ is less than approximately 100 μm and the segment lengths $l_{0, 1, \ldots}$ collectively define a wavelength selective grating length $L_{DBR}$ that is between approximately 600 μm and approximately 750 μm;
at least two phase jumps reside on each side of the midpoint $C_L$ or shifted midpoint $C_L^*$ of the DBR section;
each phase jump has a complementary phase jump of substantially equal magnitude and each constant-phase segment has a complementary constant-phase segment of substantially equal segment length on an opposite side of the midpoint $C_L$ or shifted midpoint $C_L^*$ of the DBR section;
the Bragg wavelength $\lambda_B$, the phase jumps $\phi_{J1}$, $\phi_{J2}$, $\phi_{J3}$, and $\phi_{J4}$, and the segment lengths $l_0$, $l_1$, $l_2$, $l_3$, $l_4$, $l_5$ are such that the wavelength selective grating exhibits a plurality of dominant reflectivity peaks in the form of sidebands S1, S2, etc. about a central Bragg wavelength $\lambda_B$ of the grating; and
the two sidebands closest to the central Bragg wavelength $\lambda_B$ of the grating are separated by at least about 1.6 nm.

* * * * *